(12) United States Patent
Allred

(10) Patent No.: US 7,321,912 B2
(45) Date of Patent: Jan. 22, 2008

(54) DEVICE WITH DB-TO-LINEAR GAIN CONVERSION

(75) Inventor: Rustin W. Allred, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 644 days.

(21) Appl. No.: 10/603,030

(22) Filed: Jun. 24, 2003

(65) Prior Publication Data

US 2004/0267842 A1    Dec. 30, 2004

(51) Int. Cl.
G06F 7/483    (2006.01)
(52) U.S. Cl. .................................... 708/277
(58) Field of Classification Search ............... 708/277
See application file for complete search history.

(56) References Cited

U.S. PATENT DOCUMENTS

| 2003/0014453 | A1* | 1/2003 | Challa et al. ............ 708/277 |
| 2004/0184569 | A1* | 9/2004 | Challa et al. ............ 375/345 |
| 2004/0252209 | A1* | 12/2004 | Loose .................... 348/255 |

* cited by examiner

*Primary Examiner*—D. H. Malzahn
(74) *Attorney, Agent, or Firm*—Wade J. Brady, III; Frederick J. Telecky, Jr.

(57) ABSTRACT

An electronic dB-to-linear gain conversion system (10). The system comprises an input (12) for receiving a gain index signal (GI) representing a desired dB value. The desired dB value is selected from a set having an integer number S of dB values. The system also comprises a storage circuit (16) for storing an integer number V of linear gain values and circuitry for producing a linear gain signal (LG) in response to the gain index signal and to one of the V linear gain values. In the preferred embodiment, V is less than S.

27 Claims, 1 Drawing Sheet

DEVICE WITH DB-TO-LINEAR GAIN CONVERSION

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to a device that includes a dB-to-linear gain conversion system.

Electronic circuits have become prevalent in numerous applications and are used in devices in personal, business, and other environments. Demands of the marketplace affect many design aspects of these circuits, including factors such as device size, complexity, and cost. Various electronic circuits are directed to audio signal processing and, quite often, these circuits also are subject to these design factors. The preferred embodiments have particular application in such circuits, and may be used in other contexts as well.

In the field of audio processing, gain is considered either in linear space or in so-called dB space, where the relationship between the two is known and is shown in the following Equation 1a:

$$\text{Gain (in dB)} = 20 \log_{10}(\text{linear gain}) \quad \text{Equation 1a}$$

Also, Equation 1a may be re-arranged to solve for linear gain to express it in terms of dB gain as shown in the following Equation 1b:

$$\text{linear gain} = 10^{\frac{\text{Gain(in dB)}}{20}} \quad \text{Equation 1b}$$

Thus, gain can be considered in either space, and some designers often prefer one over the other. Indeed, in the context of digital audio design often dB space is more readily discussed. In dB space, the doubling of an audio signal gain (e.g., volume), that is, an increase times two in linear space, is often referred to as a +6 dB increase; actually, this statement is an approximation in that a linear increase times two equals a dB increase of slightly more than 6 dB, where the true difference is as shown in the following Equation 1c:

$$20 \log_{10}(2) = 6.02059991327962 \quad \text{Equation 1c}$$

Thus, a digital designer seeking a linear gain increase times two often refers to this as a 6 dB increase, or seeking a linear gain times four might call for a 12 dB increase, and so forth. Further, to simplify the remaining discussion in this document, the result of Equation 1c is rounded to a value of 6.02 dB.

Given the preceding, in some prior art digital audio processing circuits, a user input is used to control a gain adjustment, where in response to the user provides the circuit imposes a gain on a processed signal. Typically, the gain control signal is provided by an independent conversion circuit, which consists of a large look-up table so as to derive the signal based on a desired dB change. For example, assume that a system provides a range of +6 dB to −39 dB, and permits adjustments at a granularity (or step) of 3 dB. In this instance, the look-up table may appear as shown in the following Table 1:

TABLE 1

| Select dB | Linear gain input | Select dB | Linear gain input |
|---|---|---|---|
| 6 | 1.9953 | −18 | 0.1259 |
| 3 | 1.4125 | −21 | 0.0891 |
| 0 | 1 | −2 | 0.7943 |
| −3 | 0.7079 | −27 | 0.0447 |
| −6 | 0.5012 | −30 | 0.0316 |
| −9 | 0.3548 | −33 | 0.0224 |
| −12 | 0.2512 | −36 | 0.0158 |
| −15 | 0.1778 | −39 | 0.0112 |

Given Table 1, when a user desires a certain dB adjustment in the gain of the processing circuit, the user provides some type of input and the appropriate linear gain is found in Table 1 and provided to the circuit. The user might cause the table to be consulted by turning a knob or otherwise providing an electrical signal of a certain magnitude, and that signal represents a dB magnitude that is then converted, via Table 1, to a corresponding linear gain. For example, if the user desires a gain of 3 dB, then the conversion circuit performs the look-up and a linear gain of 1.4125 is provided. As another example, if the user desires a gain of −6 dB, then the conversion circuit performs the look-up and a linear gain of 0.5012 is provided. The remaining examples will be appreciated by one skilled in the art.

While the approach of providing linear gain as described above has proven workable in various implementation, the present inventor has observed that it may be improved. For example, for a range of dB values from an upper limit U to a lower limit L, and with a granularity GR, then the prior art approach requires a table that stores a number of values equal to {(U−L)/GR+1}; thus, in the example of Table 1, U=6, L=−39, GR=3 and, hence, a total of 16 values are stored. Thus, where U and L are considerably distant from one another, and/or where G is small, the storage requirements for the look-up table can become quite large, thereby mandating sufficient hardware to accommodate this storage. Such requirements increase device size and cost, both of which may prove unacceptable in some implementations. Even if acceptable, a more efficient and desirable approach would require lesser storage for a same value of U, L, and GR. In view of these considerations as well as still further examples of possible drawbacks of the prior art as will be ascertainable by one skilled in the art, the present inventor endeavors to improve upon these matters as shown below in connection with the preferred embodiments.

BRIEF SUMMARY OF THE INVENTION

In the preferred embodiment, there is an electronic dB-to-linear gain conversion system. The system comprises an input for receiving a gain index signal representing a desired dB value. The desired dB value is selected from a set having an integer number S of dB values. The system also comprises a storage circuit for storing an integer number V of linear gain values and circuitry for producing a linear gain signal in response to the gain index signal and to one of the V linear gain values. In the preferred embodiment, V is less than S.

Other aspects are also disclosed and claimed.

DETAILED DESCRIPTION OF THE INVENTION

Figure 1:
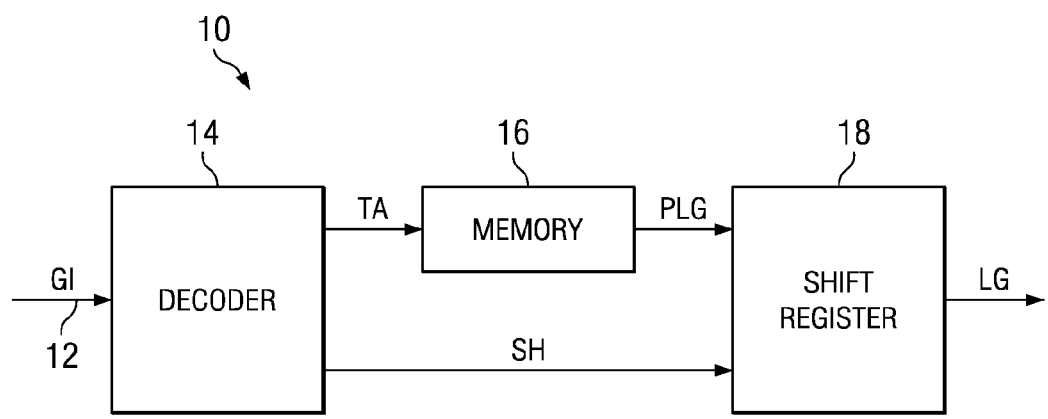
FIG. 1 illustrates a block diagram of a preferred embodiment system.

FIG. 1 illustrates a block diagram of a dB-to-linear gain conversion system designated generally at 10. In a preferred embodiment, system 10 may be constructed using a single integrated circuit or, as an alternative in another preferred embodiment, more than one device may be combined to form system 10. Further, system 10 also may be constructed in connection with a device that provides additional functionality, such as an audio processing circuit or other electronic apparatus that benefits from a dB-to-linear gain conversion. For example, system 10 may be incorporated as part of a digital volume control in an audio device, where the digital input to system 10, discussed below, is used to control the volume of the electronic apparatus. Various other applications will be appreciated by one skilled in the art.

Turning to system 10, it includes an input 12 for receiving a gain index GI. As detailed later, gain index GI is a digital input, preferably provided by a user (e.g., through a user circuit) that represents a dB value and corresponds to a requested or desired amount of linear gain. As also appreciated later, in the preferred embodiment the gain index GI is selected from one of a series of sequential values, where the range of the sequence depends on the range of available dB values as well as the uniform granularity between each step along that range. Input 12 is connected to a decoder 14. Decoder 14 represents sufficient circuitry for decoding gain index GI into two values, namely, a table address TA and a shift value SH. Table address TA is connected as an input to a memory 16, which may be any type of storage device capable of storing a table consistent with the discussion provided later and wherein the contents of that table are addressable by table address TA; as further appreciated from a later discussion, table address TA, as corresponding to a given gain index GI, causes a preliminary linear gain PLG to be output by memory 16 as an input to a shift register 18. Returning to decoder 14, also in response to gain index GI, it outputs shift value SH as an input to shift register 18. Shift register 18 is preferably constructed according to various known principles for achieving a shifting device, as consistent with the remaining teachings of this document. In any event, and as a result of the preceding, shift register 18 shifts preliminary linear gain PLG an amount as indicated by shift value SH, where shift value SH also may indicate a shift of zero in which case no shift occurs. As a result of the shift (or zero shift), preliminary linear gain PLG is converted into the ultimate output of system 10, a linear gain LG. Accordingly, in overall operation, system 10 receives gain index GI and in response outputs a linear gain LG corresponding to that gain index GI. The details for accomplishing this operation are discussed in the remainder of this document.

Looking now to memory 16 in greater detail and the table stored therein, one aspect of the preferred embodiments comes from a recognition of the relationship of the increase in linear gain as corresponding to an increase in dB gain. To appreciate this relationship, consider the following Table 2.

TABLE 2

| dB | linear gain |
|---|---|
| 0 | 1 |
| 6.02 | 2 |
| 12.04 | 4 |
| 18.06 | 8 |

Table 2 demonstrates that for every increase of 6.02 dB and supported by Equation 1a discussed earlier, the linear gain doubles from its previous value. For example, for a dB gain increase from 0 to 6.02 dB, the linear gain doubles from 1 to 2. As another example, for a dB gain increase from 6.02 dB to 12.04 dB, the linear gain doubles from 2 to 4. This relationship is exploited in the table of memory 16, as further explored below.

The following Table 3 further expands upon the entries of Table 2 and thereby further introduces the relationship preferably exploited in the table of memory 16. Particularly, Table 3 again lists linear gain as corresponding to the increase in dB gain, but in Table 3 a granularity (or step) between each value of approximately 1 dB is provided, where that granularity equals 1.0034 so as to provide six uniform steps from 0 dB to 6.02 dB.

TABLE 3

| dB | linear gain |
|---|---|
| 0 | 1 |
| 1.0034 | 1.1225 |
| 2.0067 | 1.2599 |
| 3.010 | 1.4142 |
| 4.0134 | 1.5873 |
| 5.0167 | 1.7817 |
| 6.02 | 1.9999 |
| 7.0234 | 2.2448 |
| 8.0267 | 2.5196 |
| 9.03 | 2.8281 |
| 10.0334 | 3.1745 |
| 11.0367 | 3.5632 |
| 12.04 | 3.9994 |
| 13.0434 | 4.4892 |
| 14.0467 | 5.0389 |
| 15.05 | 5.6559 |
| 16.0534 | 6.3485 |
| 17.0567 | 7.1258 |
| 18.06 | 7.9983 |

Table 3 again illustrates that for each increase of 6.02 dB from any dB value therein, the linear gain corresponding to the larger dB value doubles as compared to the linear gain corresponding to the lesser dB value. However, Table 3 also demonstrates this aspect for all linear gain values, including non-integer values. For example, for a 6.02 dB gain increase from 1.0034 db to 7.0234 dB, the linear gain doubles from 1.1225 to 2.2448, with a slight inaccuracy in the fourth decimal place due to rounding and removal of less significant digits. As another example, for a 6.02 dB gain increase from 4.0134 dB to 10.0334 dB, the linear gain doubles from 1.5873 to 3.1745. One skilled in the art will appreciate that this concept holds true for all other entries in Tables 2 and 3.

Given the preceding, in one aspect of the preferred embodiment, for an anticipated input of a gain index GI that may span a number of dB entries across a range greater than 6.02 dB, the present inventor has recognized that not all linear gain values corresponding to those dB entries need to be tabled. Instead, with a uniform granularity in dB as illustrated by Tables 2 and 3, then only a range of linear gains corresponding to just under 6.02 dB need be stored, because with the linear gain values corresponding to that stored range, then for a given dB value outside of that range, the linear gain corresponding to the given dB value may be determined as a power of two times one of the tabled linear gain values. For example, assume that the following Table 4, which is excerpted from Table 3, is stored in memory 16:

TABLE 4

| dB | linear gain |
|---|---|
| 13.0434 | 4.4892 |
| 14.0467 | 5.0389 |
| 15.05 | 5.6559 |
| 16.0534 | 6.3485 |
| 17.0567 | 7.1258 |
| 18.06 | 7.9983 |

As shown below, Table 4 provides the linear gain value for each indicated dB value, but additional linear gain values for other dB values not shown in Table 4 also are readily ascertainable by the preferred embodiment without having to table those additional linear gain values.

Assume as a first example with respect to Table 4 that a gain index GI input calls for a dB value of 13.0434; quite simply, therefore, the corresponding linear gain is 4.4892 as available in the stored table of memory 16. Thus, in this case and returning to FIG. 1, decoder 14 decodes the example of gain index GI to provide a table address TA that addresses this linear gain, and it is output by memory 16 as preliminary gain PLG. The preliminary gain PLG is then passed without shifting through shift register 18 to appear as the output linear gain LG.

In contrast to the preceding example, consider as a second example that a gain index GI input calls for a dB value of 7.0234; at first glance, the linear gain for that dB value is not stored in Table 4 and, thus, is not immediately available. However, because the value of 7.0234 dB is 6.02 dB away from the tabled value of 13.0434 dB, then the linear gain corresponding to 7.0234 dB may be derived from the linear gain corresponding to the tabled value of 13.0434 dB, since as shown earlier the linear gains of those two values are related to one another by a power of two. More specifically, since the value of 13.0434 dB, having a tabled linear gain, is in one range of 6.02 dB spanning {13.0434:18.06} dB, and since the linear gain sought is for a value of 7.0234 dB, which is in the next lower range of 6.02 dB spanning {7.0234:12.04} dB, then each linear gain in the latter region and corresponding to a dB value equals $2^{-1}$ times the linear gain of the dB value that is 6.02 dB greater in the former region. In other words, for this second example, since the tabled linear gain for 13.0434 dB equals 4.4892, then the linear gain for 7.0234 dB, which is 6.0234 dB less than the tabled value corresponding to 13.0434 dB, equals approximately 2.2246 (i.e., $4.4892*2^{-1} \approx 2.2246$), where this approximate result is confirmed by looking to Table 3. Similarly, therefore, for any other dB value in this next lower range of 6.02 dB spanning {7.0234:12.04} dB, then its linear gain equals $2^{-1}$ times the respective linear gain corresponding to the dB value that is 6.02 dB greater and which is tabled because it falls in the range of {13.0434:18.06} dB.

As a third example of the preceding, assume that gain index GI calls for a value of 10.0334 dB, which again does not have a corresponding linear gain value stored in Table 4. However, the value of 10.0334 dB is 6.02 dB away from the value of 16.0534 dB, which has a tabled linear gain (of 6.3485). Further, because the sought dB value is in the 6.02 dB range spanning {7.0234:12.04} dB, which is in the 6.02 dB range immediately below the 6.02 dB range spanning {13.0434:18.06} dB, then each linear gain corresponding to the former range is $2^{-1}$ times the linear gain of the dB value that is 6.02 dB larger in the latter range. In this third example, therefore, since the tabled linear gain for 16.0534 dB equals 6.3485, then the linear gain for 10.0334 dB, which is 6.02 dB less than the value 15.0534 dB having a tabled linear gain, equals approximately 3.1743 (i.e., $6.3485*2^{-1} \approx 3.1743$). Still other examples of linear gains for this immediately lower range of 6.02 dB spanning {7.0234: 12.04} dB may be confirmed by one skilled in the art.

The preceding principle applies to all other ranges of 6.02 dB and the linear gain values corresponding thereto. In other words, and as implemented in a preferred embodiment, for a given dB value in a range $\{x-6.02^+ \text{ granularity}:x\}$ having a set of respective tabled linear gain values stored in memory 16, then the linear gain for a desired dB value that is (N*6.02) apart from a dB value having a tabled linear gain is that tabled linear gain times $2^N$. As another example of this aspect, assume that that the gain index GI calls for a value of 1.0034 dB, which is in the 6.02 dB range spanning {1.0034:6.02} dB. This range is -2*6.02 apart from the tabled range corresponding to the values {13.0434: 18.06} dB and more particularly the requested value of 1.0034 dB is -2*6.02 away from the value 13.0434 dB, having a tabled respective linear gain; thus, in this example, N=-2. Accordingly, for this example and for all linear gain values in the tabled values, then the corresponding linear gain for a dB value that is -2*6.02 dB away and in the range of {1.0034: 6.02} dB is $2^{-2}$ times the corresponding tabled linear gain. In the present example, therefore, since the linear gain for 13.0434 dB equals 4.4892, then the linear gain for 1.0034 dB, which is -2*6.02=-12.04 dB away from the tabled value corresponding to 13.0434 dB, equals approximately 1.1224 (i.e., $4.4892*2^{-2} \approx 1.1224$).

Having described the tabled contents of memory 16 and the determination of linear gains either directly from that table or as powers of two times a linear gain in that table, the preceding principles may be summarized in general form for the sake of additional discussion. In the preferred embodiment, memory 16 stores a set of linear gains for a dB range spanning from some maximum value down to a minimum value which is the maximum value minus 6.02 (or 6, if rounding) plus the input granularity, so as to span the majority of a 6.02 dB (or 6 dB, if rounding) range of values. Further, each increasing linear gain in the set corresponds to a respective dB value that is the granularity step greater than the immediately-lower dB value. Thus, one skilled in the art may appreciate that the set stores a number of linear gain values equal to 6/GR, where GR is the granularity. For example, for a granularity of 3, then the tabled set stores a total of 6/3=2 linear gain values. As another example, in the case of Table 4, the granularity is 1.0034, which in some systems where a slight yield in precision may be permissible, such as audio systems, could be truncated to 1.00. Thus, in that case, Table 4 stores a total of 6/GR=6/1=6 linear gain values. In any event, for a set of different dB values as may be represented by gain index GI, and where each set value is separated from one another by a uniform granularity, one dB range of this set is $\{x-6.02^+ \text{ granularity}: x\}$ and the individual dB values may be represented as $\{dB_0, dB_1, \ldots dB_M\}$ dB, where M+1=6/GR. Given these dB values, in the preferred embodiment the corresponding linear gain for each dB value is stored in memory 16 and may be represented as $\{lg_0, lg_1, \ldots, lg_M\}$. Thus, if gain index GI corresponds to one of $\{dB_0, dB_1, \ldots dB_M\}$ dB, then the respective linear gain $\{lg_0, lg_1, \ldots, lg_M\}$ is addressed. However, if a requested gain index GI corresponds to a dB value outside of the range $\{dB_0, dB_1, \ldots dB_M\}$, then due to the uniform granularity imposed on the input, the requested gain index GI is necessarily (N*6.02) apart from a dB value $dB_x$ within the range $\{dB_0, dB_1, \ldots dB_M\}$ dB, and that value $dB_x$ has a tabled respective linear gain $lg_x$. Accordingly, the linear gain corresponding to the requested gain index GI is therefore $2^N * lg_x$.

Given the preceding and returning to FIG. 1, the overall operation of system 10 may be further appreciated. When a user provides a gain index GI, it represents a dB value that either has a linear gain tabled in memory 16 or that is N*6.02 dB apart from a dB value that has a linear gain tabled in memory 16. Thus, decoder 14 is constructed, such as in various manners detailed later, to map gain index GI to one of the linear gains $lg_x$ in the tabled linear gains $\{lg_0, lg_1, \ldots, lg_M\}$; specifically, decoder 14 provides the table address TA that will address, in memory 16, the linear gain corresponding to the dB value sought by gain index GI. Further, as shown above with respect to Tables 2 through 4, in some instances gain index GI may request a dB value in a range other than the predetermined range $\{dB_0 dB_1, \ldots dB_M\}$ dB for which linear gains are stored in memory 16. In this case, then decoder 14 issues a table address TA to address the linear gain $lg_x$, corresponding to a value $dB_x$ which is one of the predetermined dB values in $\{dB_0, dB_1, \ldots dB_M\}$ dB, where that value $dB_x$ is N*6.02 dB away from the dB value sought by gain index GI; further, decoder 14 also determines the value N described above, that is, the range distance between the predetermined range and the range corresponding to the dB value sought by gain index GI, and that value of N is provided as shift value SH to shift register 18. Accordingly, memory 16 then outputs as preliminary linear gain PLG the linear gain that is addressed by table address TA, an that value is shifted, if appropriate, by shift register 18 in response to shift value SH. As known in the binary art, a shift in one bit direction is equivalent to multiplying the pre-shifted value by a power of two; thus, shift register 18 can achieve the multiplier of $2^N$ described above, by shifting preliminary linear gain PLG a total of N times, where N is zero (i.e., no shift) in the instance where the dB value request by gain index GI is in the predetermined range $\{dB_0, dB_1, \ldots dB_M\}$ and has a corresponding tabled linear gain in $\{lg_0, lg_1, \ldots, lg_M\}$. The result of the shift (or zero shift) is provided by shift register 18 as linear gain LG.

As an additional observation with respect to the storage of the M+1 tabled linear gain values $\{lg_0, lg_1, \ldots, lg_M\}$, in a preferred embodiment note that the tabled linear gain values correspond to the largest dB values that may be requested by gain index GI. This is preferred because those values may be scaled downward by a right shift of N and thereby retain the most additional precision in the least significant digits. This aspect as well as others are further demonstrated in various examples below.

As a first example of the preceding, assume that system 10 is implemented for an application wherein the user is expected to provide a gain index GI that may correspond anywhere from 0 dB to 18 dB, and with a granularity of 0.5 dB, that is, the input can request a dB value change, implemented as a linear gain change, anywhere in the sequence of 0 dB, to 0.5 dB, to 1.0 dB, and so forth at 0.5 dB granularity increments up to 18.0 dB. Under the preferred embodiment, therefore, linear gain values are stored to correspond to a predetermined set of dB with a maximum dB value of x in the range of $\{x-6.02^+ \text{ granularity}:x\}$, and recall that preferably the largest range of possible user desired values are tabled. Thus, in the present example, x=18 dB is the largest anticipated user input request, so the entire predetermined dB range for which linear gains are tabled is $\{18-6.02+0.5:18\}$ dB, which using rounding provides a range of $\{12.5:18\}$ dB. Further, with a granularity, GR, equal to 0.5, then a total of 6/GR=6/0.5=12 linear gain values are tabled. These tabled linear gain values are as shown in the following Table 5, and correspond to the dB values as shown (although those dB values themselves need not be stored, as gain index GI is mapped to them as further shown below).

TABLE 5

| dB | linear gain |
| --- | --- |
| 12.5 | 4.2170 |
| 13.0 | 4.4668 |
| 13.5 | 4.7315 |
| 14.0 | 5.0119 |
| 14.5 | 5.3088 |
| 15.0 | 5.6234 |
| 15.5 | 5.9566 |
| 16.0 | 6.3098 |
| 16.5 | 6.6834 |
| 17.0 | 7.0795 |
| 17.5 | 7.4989 |
| 18.0 | 7.9433 |

As a second example of the preceding, assume that system 10 is implemented for an application wherein the user is expected to provide a gain index GI that may correspond anywhere from 0 dB to 18 dB, but with a granularity of 3.0 dB. In this case, again the highest dB value requested by input is 18 dB, which thereby sets the upper bound in the range $\{x-6.02^+ \text{ granularity}:x\}$. However, due to the larger granularity, the total range is $\{18-6.02+3.0:18\}$ dB, which using rounding provides a range of $\{15:18\}$ dB. Also due to the larger granularity, fewer tabled values are stored, where here the number is 6/GR=6/3=2. Thus, in this case, only two tabled linear gain values are stored in memory 16, as shown in the following Table 6.

TABLE 6

| dB | linear gain |
| --- | --- |
| 15.0 | 5.6234 |
| 18.0 | 7.9433 |

From only the two values in Table 6 and for a granularity of three, the linear gain of any other dB value for a gain index GI from 0 dB to 18 dB can be determined, according to the principles described above. For example, for a gain index GI requesting a linear gain for a value of 12.0 dB, then this value is (N=1)*6.02 dB less than 18.0 dB (rounding to the first decimal), which has a tabled linear gain of 7.9433. Thus, the preferred embodiment determines the linear gain for 12.0 dB by multiplying the linear gain for 18.0 dB by $2^{-1}$, which again can be accomplished in a binary fashion by right shifting once the tabled linear gain, 7.9433, corresponding to 18.0 dB. The result approximates a linear gain equal to $(2^{-1}*7.9433)=3.9717$. As another example, for a gain index GI requesting a linear gain for a value of 3.0 dB, this dB value is (N=2)*6.02 dB less than 15.0 dB (rounding to the first decimal), which has a tabled linear gain of 5.6234. Thus, the preferred embodiment determines the linear gain for 3.0 dB by multiplying the linear gain, 5.6234, for 15.0 dB by $2^{-2}$, which can be accomplished in a binary fashion by right shifting twice the tabled linear gain corresponding to 15.0 dB. The result approximates $(2^{-1}*5.6234)=1.4059$. Other examples will be appreciated by one skilled in the art.

Recalling that decoder 14 decodes gain index GI to identify, through the table address TA, the appropriate linear gain tabled in memory 16, note also that in one preferred embodiment, and in combination with the preceding, the number of different linear gain values stored in memory 16 totals a power of two. This requirement gives rise to a favorable manner of decoding the gain index GI by decoder 14 and in presenting the responsive table address TA, as is now explored. For sake of reference, let this power be represented as P, that is, the number of tabled linear gain values is preferably $2^P$ values. For example, assume that system 10 is to be implemented in an environment calling for the user presentation of dB values ranging from 6 dB down to −15 dB. Since the preceding has demonstrated that the number of tabled values equals 6/GR, then by setting GR (i.e., the granularity) equal to 3, then 6/GR=6/3=2, which is a power of 2, that is, P=1. With this granularity, then a total of eight different user inputs could be presented, giving rise to an input value selected from the set of {6, 3, 0, −3, −6, −9, −12, −15} dB. As demonstrated above, to obtain the linear gain values for each of these inputs, the preferred embodiment does not require storage of the linear gain for each of the set of eight inputs. Instead, consistent with the earlier teachings, the stored linear gain values correspond to a set of dB with a maximum dB value of x in the range of {x−6.02+ granularity:x}, where the largest range of possible user desired values are tabled. Thus, in the present example, x=6 dB is the largest anticipated user input, so the entire range is {6−6.02+3:6} dB, which using rounding provides a range of {3:6} dB. Thus, in this case, the tabled linear gain values are as shown in the following Table 7, and correspond to the dB values as shown.

TABLE 7

| dB | linear gain | Reference |
|---|---|---|
| 6.0 | 11.9953 | $lg_0$ |
| 3.0 | 11.4125 | $lg_1$ |

Continuing with the example presented in connection with Table 7, let the linear gain of 6.0 dB be referenced as $lg_0$ and the linear gain of 3.0 dB be referenced as $lg_1$. Thus, the linear gain of any other dB value in the user input set of {0, −3, −6, −9, −12, −15} dB may be ascertained from either $lg_0$ or $lg_1$, by multiplying the appropriate one of those two values times $2^N$. Specifically, for any dB value in that set that is N*6 away from $lg_0$, then $lg_0$ is multiplied times $2^N$ to determine the corresponding linear gain, and for any dB value in that set that is N*6 away from $lg_1$, then $lg_1$ is multiplied times $2^N$ to determine the corresponding linear gain. Given that only two values, $lg_0$ and $lg_1$ are tabled, then note that only one bit is required to identify either of those two values; hence, for this aspect, gain index GI need only include one bit to serve this function.

Also in connection with the example presented in connection with Table 7, note that for the eight different user inputs {6, 3, 0, −3, −6, −9, −12, −15} dB, a first group {6,3} dB has tabled linear gain values, and the inputs further include a second group {0, −3} dB, which has respective values that are 6 dB less than the first group, that is, for which N=−1. Similarly, the eight different user inputs include a third group {−6, −9} dB, which has respective values that are 12 dB less than the first group, that is, for which N=−2, and a fourth group {−12, −15} dB, which has respective values that are 18 dB less than the first group, that is, for which N=−3. Further, recall for the first group of dB values that may be represented by user inputs, {6, 3} dB, there is no shift (i.e., N=0) because the linear gain values are tabled and no shift is required of those values. Accordingly, under the preferred embodiment, gain index GI is also provided additional bits to identify the different possible values of N. Since N can take four different values in this example (i.e., 0 through 3), then two bits are included in GI to serve this function.

Combining the two different observations above with respect to the bits included in gain index GI in the example of Table 7, gain index GI is a three bit number, with one bit to identify either $lg_0$ or $lg_1$, and two bits to identify one of four values of N. Thus, the different values of GI, as well as the resulting decoding operation of decoder 14, are shown in the following Table 8:

TABLE 8

| dB | GI (binary) | TA (decimal) | SH = N (decimal) |
|---|---|---|---|
| 6 | 000 | 0 (i.e., $lg_0$) | 0 |
| 3 | 001 | 1 (i.e., $lg_1$) | 0 |
| 0 | 010 | 0 (i.e., $lg_0$) | 1 |
| −3 | 011 | 1 (i.e., $lg_1$) | 1 |
| −6 | 100 | 0 (i.e., $lg_0$) | 2 |
| −9 | 101 | 1 (i.e., $lg_1$) | 2 |
| −12 | 110 | 0 (i.e., $lg_0$) | 3 |
| −15 | 111 | 1 (i.e., $lg_1$) | 3 |

From Table 8, it may be seen that by having $2^P$ linear gain values tabled in memory 16 (where P=1 in the present example) in the preferred embodiment, then the P least significant bits of GI may be used directly as the table address TA. Further, the remaining more significant bits of GI may then be used to numerically indicate the extent of the shift, which is shown above mathematically to be N and which for purposes of function in system 10 is provided as the shift value SH. For example, suppose that a user seeks a gain adjustment of 6 dB. In this case, the user provides a gain index of GI=000, and the P=1 least significant bit thereby addresses $lg_0$, which from Table 7 equals 1.995262 and which is thereby output as preliminary linear gain PLG. Also, the remaining two most significant bits provide a value of N=SH=0, meaning no shift operation is performed by shift register 18. Instead, preliminary linear gain PLG is output as the final linear gain, LG. As another example, suppose that a user seeks a gain adjustment of −15 dB. In this case, the user provides a gain index of GI=111, and the P=1 least significant bit thereby addresses $lg_1$, which from Table 7 equals 1.4125 and which is thereby output as preliminary linear gain PLG. Also, the remaining two most significant bits provide a value of N=SH=3, meaning a right shift operation by three bits is performed by shift register 18. Note that since the stored linear gain values are the largest of the possible outputs (since they correspond to the largest dB values that can be requested by gain index GI, then all shifts can be assumed to be right shifts; however, if a different range were used, then an additional provision may be allowed for a sign bit to indicate the required direction of the shift. In any event, completing the current example that seeks the linear gain for −15 dB, mathematically, the value of 3 from the two most significant bits of gain index GI equates to a multiplication times $2^{-3}$, thereby producing the result of $(1.4125*2^{-3})=0.1766$, which is output as the final linear gain, LG.

In an alternative embodiment where the number of linear gain values tabled in memory 16 is not a power of two, at least two other approaches may be implemented for causing decoder 14 to decode gain index GI so as to generate a proper table address TA and a shift value SH. In a first approach, gain index GI may be considered an R bit input from which table address TA and shift value SH are to be derived, with a logic block that simply accomplishes the appropriate mapping of an input to a desired output. In a second approach, gain index GI is divided by the number of linear gain values tabled in memory 16, where recall that number is 6/GR; further, the result is truncated to find the shift value SH; thus, this operation may be as shown in the following Equation 2:

$$SH = \text{truncate}(GI/(6/GR)) \qquad \text{Equation 2}$$

Since the value of 6/GR is fixed, then preferably the reciprocal of that value is stored and then multiplied to accomplish the division operation in Equation 2, so as not to unduly complicate the circuit by requiring it to perform division. Next, table address TA may be found from the following Equation 3:

$$TA = GI - (SH*(6/GR)) \qquad \text{Equation 3}$$

Equation 3 indicates that table address TA is a remaining amount, that is, it is what is left from gain index GI once the information in it as pertaining to the shift amount and the number of tabled entries (i.e., 6/GR) are removed; for example, if Equation 3 were applied to the example of Table 8, above, consider the instance where GI=110 (i.e., decimal 6). Thus, solving for TA using Equation 3 would be as shown in the following Equation 3a:

$$TA = 6 - (3*(6/3)) = 0 \qquad \text{Equation 3a}$$

The result of 0 in Equation 3a, as shown in the example of Table 8, corresponds to address $lg_0$. Thus, in this case, memory 16 would output $lg_0$ which would then be shifted right three times (i.e., N=3); thus, for the input of GI=110 corresponding to a dB increase of −12 dB, memory 16 outputs a preliminary gain PLG=1.9953 (see Table 7), and that value is thrice right shifted to obtain a mathematical result equal to $2^{-3}*1.9953=0.2494$. As another example of applying Equation 3, consider the instance from Table 8 where GI=101 (i.e., decimal 5). Thus, solving for TA using Equation 3 would be as shown in the following Equation 3b:

$$TA = 5 - (2*(6/3)) = 1 \qquad \text{Equation 3b}$$

The result of 1 in Equation 3b, as shown in the example of Table 8, corresponds to address $lg_1$. Thus, in this case, memory 16 would output $lg_1$ which would then be shifted right two times (i.e., N=2); thus, for the input of GI=101 corresponding to a dB increase of −9 dB, memory 16 outputs a preliminary gain PLG=1.4125 (see Table 7), and that value is twice right shifted to obtain a mathematical result equal to $2^{-2}*1.4125=0.3531$.

In still another alternative embodiment, it is preferable that at least one linear gain value tabled in memory 16 is a power of two. Such an approach may be desired because, insofar as that specific linear gain is shifted by N, then the bit structure remains the same (albeit shifted) since a power of two is being shifted and, hence, there is no need to round the number. Thus, the application of this linear gain to an audio signal produces the purest result, where some critical listeners may perceive that they can discern the difference between this type of adjustment versus one where bits are actually changed due to rounding which occurs when a linear gain that is not a power of two is shifted by N. In this embodiment, once the granularity for a system is determined, one of the linear gains therein can be set at a power of two along with a determination of its corresponding dB value, with the remaining dB values and their linear gains then established given the granularity. For example, by applying this principle to Table 3, the linear gain of 1.9999 corresponding to 6.02 dB can be more precisely stated as 2.0 for 6.0206 dB, and the remaining values are then adjusted as shown in the following Table 9:

TABLE 9

| dB | linear gain |
|---|---|
| 0 | 1 |
| 1.0034 | 1.1225 |
| 2.0069 | 1.2599 |
| 3.0103 | 1.4142 |
| 4.0137 | 1.5874 |
| 5.0172 | 1.7818 |
| 6.0206 | 2 |
| 7.024 | 2.2449 |
| 8.0275 | 2.5198 |
| 9.0309 | 2.8284 |
| 10.0343 | 3.1748 |
| 11.0378 | 3.5636 |
| 12.0412 | 4 |
| 13.0446 | 4.4898 |
| 14.0481 | 5.0397 |
| 15.0515 | 5.6569 |
| 16.0549 | 6.3496 |
| 17.0584 | 7.1272 |
| 18.0618 | 8 |

Given Table 9, recall also that in the preferred embodiment only the largest linear gain values are tabled in memory 16. Thus, for Table 9, the in the present example, x=18.0618 dB is the largest anticipated user input request. Accordingly, the linear gain for x=18.0618 dB, which is the preferred power of 2 (i.e., a linear gain of 8), would be tabled, and given the granularity of 6 so would be the five immediately smaller values in Table 9. From these values, then any time a user inputs a value corresponding to 18.0618 dB or a dB value that is N times 6.0206 apart from that dB value, then the pure linear gain of 8 or an exact shift of it would be applied as the gain.

From the above, it may be appreciated that the above embodiments provide a dB-to-linear gain conversion system that may be included in numerous electronic devices, and with various advantages over the prior art. For example, for a system wherein a large number of possible user-provided (or user-invoked) dB values are required to be converted into corresponding linear gain values, only 6/GR of those linear gain values are preferably tabled. Thus, based on the granularity of the system as well as the number of possible user inputs, the relative reduction in required memory space can be considerable. This reduction can improve device size, speed, power consumption, and cost, each of which may be an important factor in contemporary circuit design and implementation. Further, as another advantage, various alternatives have been provided that thereby present various combinations that may be included in alternative preferred embodiments and still others may be implemented. Thus, these examples provide other bases from which one skilled in the art may ascertain yet other variations, and indeed while the present embodiments have been described in detail, various substitutions, modifications or alterations could be made to the descriptions set forth above without departing from the inventive scope which is defined by the following claims.

The invention claimed is:

1. An electronic dB-to-linear gain conversion system, comprising:
   an input for receiving a gain index signal representing a desired dB value, wherein the desired dB value is selected from a set having an integer number S of dB values;
   a storage circuit for storing an integer number V of linear gain values; and
   circuitry for producing a linear gain signal in response to the gain index signal and to one of the V linear gain values; and wherein V is less than S.

2. The system of claim 1 wherein each linear gain value in the integer number V of linear gain values corresponds to a respective dB value in a subset of the set.

3. The system of claim 2 wherein each linear gain value in the integer number V of linear gain values equals ten raised to a power of a respective dB value in the set divided by 20.

4. The system of claim 1 wherein one linear gain value in the integer number V of linear gain values corresponds to a largest dB value in the set.

5. The system of claim 1:
   wherein a uniform granularity GR exists between each successively larger dB value in the set; and
   wherein V=6/GR.

6. The system of claim 1 wherein the circuitry for producing the linear gain signal comprises:
   circuitry for selecting one linear gain value of the integer number V of linear gain values in response to the linear gain index signal, wherein the selected linear gain corresponds to a given dB value in the set; and
   circuitry for multiplying the selected one linear gain value times two raised to a power equal to an integer N, wherein the desired dB value is approximately the integer N times 6 apart from the given dB value.

7. The system of claim 6 wherein each linear gain value in the integer number V of linear gain values equals ten raised to a power of a respective dB value in the set divided by 20.

8. The system of claim 6:
   wherein the selected one linear gain value comprises a binary number; and
   wherein the circuitry for multiplying comprises circuitry for shifting the binary number the integer N times.

9. The system of claim 6:
   wherein each linear gain value in the integer number V of linear gain values equals ten raised to a power of a respective dB value in the set divided by 20;
   wherein the selected one linear gain value comprises a binary number; and
   wherein the circuitry for multiplying comprises circuitry for shifting the binary number the integer N times.

10. The system of claim 1 wherein the circuitry for producing the linear gain signal comprises:
    circuitry for selecting one linear gain value of the integer number V of linear gain values in response to the linear gain signal, wherein the selected linear gain corresponds to a given dB value in the set;
    circuitry for multiplying the selected one linear gain value times two raised to a power equal to an integer N, wherein the desired dB value is approximately the integer N times 6 apart from the given dB value; and
    circuitry for decoding the gain index signal to determine the integer N.

11. The system of claim 10:
    wherein the gain index signal comprises a plurality of bits arranged in an order from a least significant bit to a most significant bit; and
    wherein the integer N is represented in part or whole by the least significant bit of the gain index signal.

12. The system of claim 11 wherein the circuitry for selecting comprises circuitry for addressing the one linear address in the storage circuit in response to at least the most significant bit.

13. The system of claim 10:
    wherein the circuitry for decoding comprises logic circuitry; and
    wherein the circuitry for selecting comprises logic circuitry for decoding the gain index signal into an address for the storage circuit, wherein the address corresponds to the one linear gain value.

14. The system of claim 10:
    wherein a uniform granularity GR exists between each successively larger dB value in the set;
    wherein V=6/GR;
    wherein the circuitry for decoding comprises circuitry for determining the integer N according to an equation that truncates the result of the gain index signal divided by the integer V; and
    wherein the circuitry for selecting comprises circuitry for determining an address for the storage circuit in response to the gain index signal, wherein the address equals the gain index signal minus the product of the integer N times the integer V.

15. The system of claim 1 and further comprising circuitry for producing an audio signal in response to the linear gain signal.

16. The system of claim 1:
    wherein each linear gain value in the integer number V of linear gain values corresponds to a respective dB value in the set;
    wherein each linear gain value in the integer number V of linear gain values equals ten raised to a power of a respective dB value in the set divided by 20;
    wherein one linear gain value in the integer number V of linear gain values corresponds to a largest dB value in the set.

17. The system of claim 16:
    wherein a uniform granularity GR exists between each successively larger dB value in the set; and
    wherein V=6/GR.

18. The system of claim 17 wherein the circuitry for producing the linear gain signal comprises:
    circuitry for selecting one linear gain value of the integer number V of linear gain values in response to the linear gain signal, wherein the selected linear gain corresponds to a given dB value in the set; and
    circuitry for multiplying the selected one linear gain value times two raised to a power equal to an integer N, wherein the desired dB value is approximately the integer N times 6 apart from the given dB value.

19. The system of claim 1:
    wherein each linear gain value in the integer number V of linear gain values corresponds to a respective dB value in the set;
    wherein each linear gain value in the integer number V of linear gain values equals ten raised to a power of a respective dB value in the set divided by 20; and wherein at least one linear gain value in the integer number V of linear gain values equals a power of two.

20. A method of electronically converting a gain index signal representing a desired dB value for an audio signal, comprising:
   receiving the gain index signal representing a desired dB value for an audio signal, wherein the desired dB value is selected from a set having an integer number S of dB values;
   an integer number V of linear gain values; and
   for producing a linear gain signal to apply to said audio signal in response to the gain index signal and to one of the V linear gain values; and
   wherein V is less than S.

21. The method of claim 20 wherein each linear gain value in the integer number V of linear gain values corresponds to a respective dB value in a subset of the set.

22. The method of claim 21 wherein each linear gain value in the integer number V of linear gain values equals ten raised to a power of a respective dB value in the set divided by 20.

23. The method of claim 20 wherein one linear gain value in the integer number V of linear gain values corresponds to a largest dB value in the set.

24. The method of claim 20:
   wherein a uniform granularity GR exists between each successively larger dB value in the set; and
   wherein V=6/GR.

25. The method of claim 20 wherein the step of producing the linear gain signal comprises:
   selecting one linear gain value of the integer number V of linear gain values in response to the linear gain signal, wherein the selected linear gain corresponds to a given dB value in the set; and
   multiplying the selected one linear gain value times two raised to a power equal to an integer N, wherein the desired dB value is approximately the integer N times 6 apart from the given dB value.

26. The method of claim 25 wherein each linear gain value in the integer number V of linear gain values equals ten raised to a power of a respective dB value in the set divided by 20.

27. The method of claim 25:
   wherein the selected one linear gain value comprises a binary number; and
   wherein the step of multiplying comprises shifting the binary number the integer N times.

* * * * *